United States Patent
Shiraishi et al.

(10) Patent No.: US 8,481,863 B2
(45) Date of Patent: Jul. 9, 2013

(54) SUBSTRATE AND METHOD FOR MANUFACTURING THE SAME

(75) Inventors: Akinori Shiraishi, Nagano (JP); Kei Murayama, Nagano (JP); Masahiro Sunohara, Nagano (JP); Naoyuki Koizumi, Nagano (JP); Mitsutoshi Higashi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 956 days.

(21) Appl. No.: 12/061,203

(22) Filed: Apr. 2, 2008

(65) Prior Publication Data

US 2008/0251287 A1    Oct. 16, 2008

(30) Foreign Application Priority Data

Apr. 3, 2007    (JP) .................. 2007-097614

(51) Int. Cl.
  *H05K 1/16*    (2006.01)
  *H05K 1/11*    (2006.01)
  *H01K 3/10*    (2006.01)

(52) U.S. Cl.
  USPC ........... 174/260; 174/261; 174/264; 361/760; 361/761; 29/846; 29/852; 29/831

(58) Field of Classification Search
  None
  See application file for complete search history.

(56) References Cited

U.S. PATENT DOCUMENTS

| 5,032,694 | A * | 7/1991 | Ishihara et al. | ............... 174/256 |
| 7,354,799 | B2 * | 4/2008 | Kinderknecht et al. | ...... 438/109 |
| 7,916,492 | B1 * | 3/2011 | Zhong et al. | ................... 361/760 |

| 2004/0161926 | A1 | 8/2004 | Yamaguchi |
| 2004/0212086 | A1 | 10/2004 | Dotta et al. |
| 2007/0052067 | A1 | 3/2007 | Umemoto |

FOREIGN PATENT DOCUMENTS

| EP | 1653510 | 5/2006 |
| JP | A-H11-26629 | 1/1999 |
| JP | 2005-11987 | 1/2005 |
| JP | 2005-19966 | 1/2005 |

OTHER PUBLICATIONS

Office Action dated Jun. 5, 2012 in corresponding Japanese Patent App. No. 2007-097614 and English translation.

\* cited by examiner

*Primary Examiner* — Jayprakash N Gandhi
*Assistant Examiner* — Dion Ferguson
(74) *Attorney, Agent, or Firm* — Drinker Biddle & Reath LLP

(57) ABSTRACT

A substrate includes a storage portion which is defined by a base for mounting a light emitting element and a wall portion standing up on and from the base. A package is structured such that the upper end of the wall portion so formed as to surround the periphery of the storage portion is connected to a cover to thereby seal a light emitting element. A seal structure is composed of an uneven portion formed on the lower surface side surface of the base, a close contact layer formed on the surface of the uneven portion, a power supply layer formed on the close contact layer, and an electrode layer formed on the surface of the power supply layer. The uneven portion includes a first recessed portion formed at a position spaced in the radial direction from the outer periphery of a through electrode or from the inner wall of a through hole, and a second recessed portion formed at a position spaced further outwardly from the first recessed portion.

12 Claims, 20 Drawing Sheets

SUBSTRATE AND METHOD FOR MANUFACTURING THE SAME

This application claims priority to Japanese Patent Application No. 2007-097614, filed Apr. 3, 2007, in the Japanese Patent Office. The Japanese Patent Application No. 2007-097614 is incorporated by reference in its entirety.

TECHNICAL FIELD

The present disclosure relates to a substrate and a method for manufacturing the substrate. Specifically, the invention relates to a substrate which is used in a package to be airtight sealed and includes a through electrode, and to a method for manufacturing the substrate.

RELATED ART

As an element which is formed or mounted on a substrate, there are available various kinds of elements. Some kinds of elements may preferably be used in such a manner that they are sealed on the substrate.

For example, an optical function element such as an LED (Light Emitting Diode), or an element (which is hereinafter referred to as a MEMS element) using a micro electro mechanical system (which is also referred to as MEMS) has a fine and delicate structure; and, therefore, when such element is used on the substrate, structurally, it may preferably be used in such a manner that it is sealed.

As this type of element, besides the optical function element, there are available a pressure sensor, an acceleration sensor, a gyro, and the like. This type of element may preferably be used in a vacuum state or in a reduced pressure state, or in an atmosphere displaced by inert gas; and, it may preferably be stored in a space sealed by such seal structure that is free from the open air and dust contained in the open air.

As a method for manufacturing an airtight sealed package of this type, there is proposed a method which seals a semiconductor element by putting together silicone wafers (for example, see the Japanese Patent Application Publication No. 2005-19966).

On the other hand, in the above-mentioned package using the airtight sealed structure, it is structured such that the electrode of an element is connected to a through electrode penetrating through a silicone substrate (which is hereinafter referred to as a substrate) to provide an electrical connection between them, whereby the size and thickness of the package can be reduced.

Also, in a package including a through electrode, when close contact property between the through electrode and an insulating layer formed on the inner wall of the through hole of the substrate is reduced or deteriorated, there is a fear that the open air can flow from the through hole into a space which is airtight sealed. As means for preventing such reduction of the airtight performance in the through hole, for example, there is known a method in which a conductive layer is formed on the end portion of the through electrode formed in the through hole and on the surface of the substrate existing in the periphery of the through electrode to secure the airtight performance owing to the close contact between the conductive layer and the surface of the substrate (for example, see Japanese Patent Application Publication No. 2005-11987).

However, in the above-mentioned method, in order to secure close contact between the conductive layer and the surface of the substrate, it is necessary to increase the size of the conductive layer in the radial direction with the through electrode as a center thereof, which results in the increased size of the package itself.

Also, as the distance between the mutually adjoining through electrodes decreases with the reduced sizes of the respective elements, a space for installation of the conductive layer is limited accordingly, which makes it difficult to secure sufficient airtight performance.

SUMMARY

Exemplary embodiments of the present invention provide a substrate and a method for manufacturing such substrate.

Exemplary embodiments of the present invention has the following means.

Specifically, according to the invention, a method for manufacturing a substrate having a through electrode formed in at least a portion of a through hole, comprises the steps of:

forming, on a surface of the substrate situated in the periphery of a portion where the through hole is formed or will be formed, an uneven portion including at least one of a recessed portion and a projecting portion; and, forming an electrode layer on a surface of the uneven portion.

The uneven portion may be formed in such a manner that it surrounds the periphery of the through hole.

The uneven portion may include at least a plurality of recessed portions or a plurality of projecting portions, and the plurality of recessed portions or the plurality of projecting portions may be formed in a peripheral direction of the substrate at positions different from each other with respect to the center of the through hole.

The method for manufacturing a substrate may further comprise a step of: forming a close contact layer having a close contact property and a conductive property on the surface of the uneven portion.

The method for manufacturing a substrate may further comprise a step of; forming the through electrode in the portion of the through hole, wherein the electrode layer is formed on an end portion of the through electrode in the through hole.

The method for manufacturing a substrate may further comprise a step of: performing a roughening processing on an inner wall of the through hole.

The method for manufacturing a substrate may further comprise a step of: forming a close contact layer having a close contact property and a conductive property on the inner wall of the through hole and on the surface of the uneven portion.

The method for manufacturing a substrate may further comprise a step of: forming the through hole in the substrate, wherein the through hole is formed before the uneven portion is formed.

The method for manufacturing a substrate may further comprise a step of: forming the through hole in the substrate, wherein the through hole and the uneven portion are formed at the same time.

According to the invention, the uneven portion including at least a recessed portion or a projecting portion is formed on the surface of the substrate situated in the periphery of the through hole; and, the electrode layer is formed on the surface of the uneven portion. Therefore, since the connecting distance between the surface of the substrate and electrode layer can be substantially extended according to the shape of the recessed portion or projecting portion, not only the airtightness in the periphery of the through electrode can be enhanced further but also, even when the space for installation of the electrode layer is small, proper airtightness can be secured. Thus, the invention is also able to cope with the reduced size of the package.

Other features and advantages may be apparent from the following detailed description, the accompanying drawings and the claims.

BRIEF DESCRIPTION OF THE DRAWINGS

FIG. 2C(a) is an explanatory view of a variation of the step depicted in FIG. 2C.

FIG. 2D(a) is an explanatory view of a variation of the step depicted in FIG. 2D.

FIG. 2E(a) is an explanatory view of a variation of the step depicted in FIG. 2E.

DETAILED DESCRIPTION

Now, description will be given below of the best mode for carrying out the invention with reference to the accompanying drawings.

Embodiment 1

Figure 1:
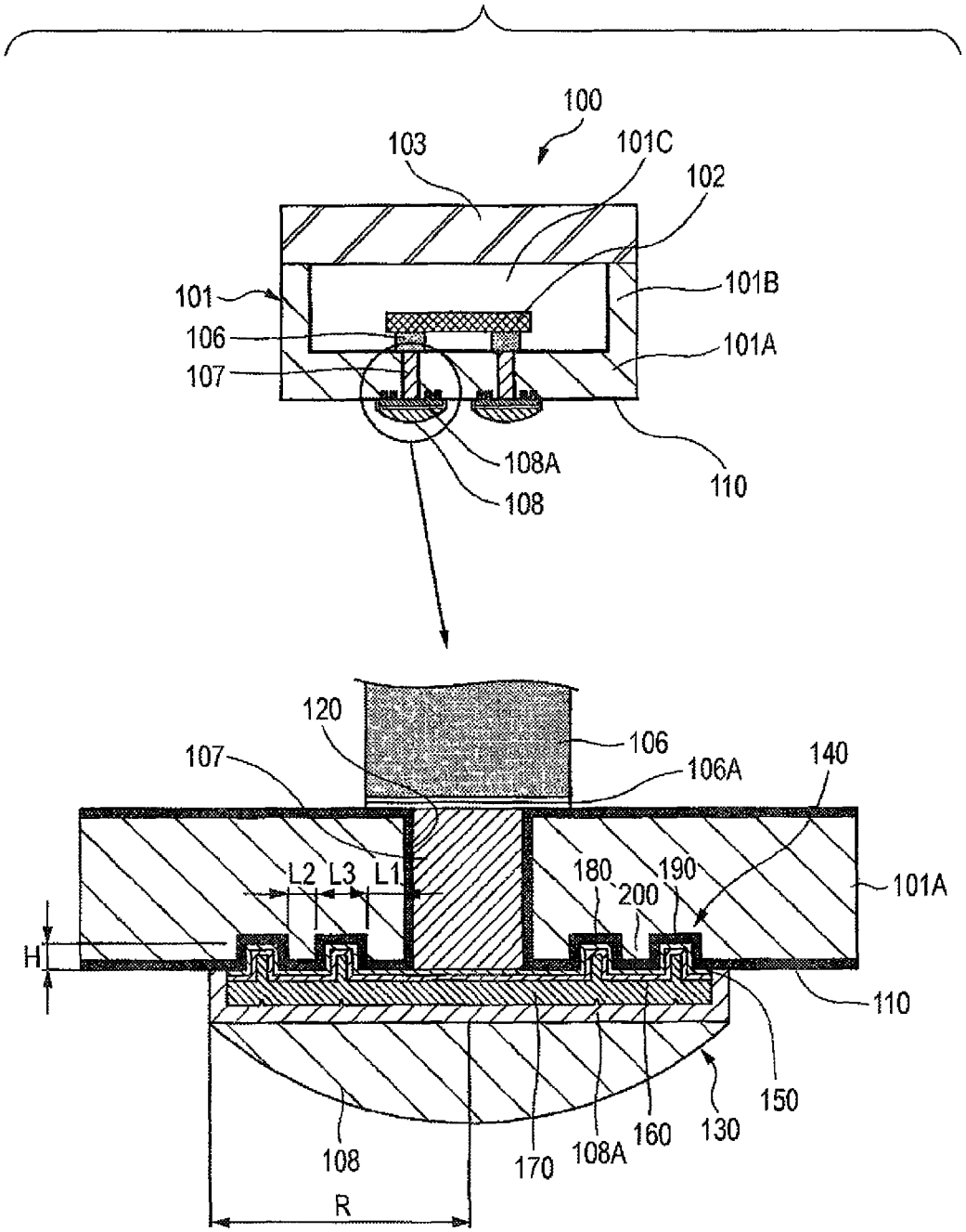
FIG. 1 is a typical longitudinal section view of a package 100 using a substrate according to an embodiment 1 of the invention.

FIG. 1 is a typical longitudinal section view of a package 100 using a substrate according to an embodiment 1 of the invention. Referring to FIG. 1, the package 100 is a semiconductor device, which includes a substrate 101 made of Si or the like and, a light emitting element 102 as an optical function element. The light emitting element 102 is made of an LED or the like and mounted on the substrate 101. The light emitting element 102 includes a base member made of sapphire (Al2O3), a P layer, an N layer, an electrode and the like.

By the way, in the present embodiment, although description is given of a structure in which the light emitting element 102 is mounted on the substrate 101, it is not limitative but, of course, the invention can also be applied to, for example, a semiconductor device structured such that a light receiving or an MEMS element is mounted on a substrate.

Also, on the light emitting element 102, there is placed a light transmissible flat-plate-shaped cover 103 made of glass or the like.

Also, on the substrate 101, there is provided a storage portion 101C which is defined by a base 101A for mounting the light emitting element 102 and a wall portion 101B provided on and rising up from the base 101A. This storage portion 101C is formed in such a direction that the upper surface side of the substrate 101 is open. And, according to the structure of the package 100, the upper end of the wall portion 101B formed so as to surround the periphery of the storage portion 101C is connected to the cover 103 to thereby seal the light emitting element 102. The light emitting element 102 is mounted in the storage portion 101C which is an airtight sealed closed space. Therefore, the storage portion 101C can be decompressed or can be filled with an inert gas, thereby being able not only to maintain the performance of the light emitting element 102 but also to lengthen the life thereof.

Also, suppose the substrate 101 and cover 103 are connected together by anode bonding, for example, when compared with they are connected together by organic material such as resin, a space for sealing the light emitting element 102 can be held clean, whereby, preferably, the quality of the light emitting element 102 is excellent.

Also, the light emitting element 102 is placed on a bump 106 made of Au. The bump 106 is electrically connected to a through electrode 107 through a connecting layer 106A. The through electrode 107 is formed so as to penetrate through the bottom surface of the substrate 101. The through electrode 107 is produced by growing Cu or Ni in a cylindrical space within the through hole 120 according to an electrolytic plating method. The connecting layer 106A includes a Ni layer and an Au layer superimposed on top of each other in such a manner that, for example, the Au layer provides a front surface. Also, the connecting layer 106A may also be made of a Ni/Pd/Au plated layer (Au provides the front surface thereof), or another plated layer.

On the opposite side (in FIG. 1, the lower end side) of the side of the through electrode 107 to which the light emitting element 102 is connected, there is formed a connecting layer 108A which includes a Ni layer and a Au layer superimposed on top of each other in such a manner that, for example, the Au layer provides the front surface. In the connecting layer 108A, there is formed a solder bump 108. That is, the formation of the through electrode 107 can facilitate the connection between the light emitting element 102 and the object to be connected existing on the outside of a space where the light emitting element 102 is sealed up. Also, between the solder bump 108 and through electrode 107, there may also be formed a connecting layer composed of, for example, a Ni/Au plated layer; however, it is omitted in FIG. 1.

Also, on the lower surface of the substrate 101, there is formed an insulating layer (silicone oxide film) 110. This insulating layer 110 insulates the substrate 101 and through electrode 107 from each other as well as the substrate 101 and bump 106 from each other.

Here, description will be given of a seal structure which seals not only a through hole 120 penetrating through the base 101A of the substrate 101 but also the through electrode 107 formed in the through hole 120. In FIG. 1, a portion, which is shown in an enlarged manner, provides the seal structure 130 of the through electrode 107. When the close contact between the through electrode 107, and the insulating layer (silicone oxide film) 110 formed on the inner wall of the through hole 120 is deteriorated to thereby cause a small clearance, the seal structure 130 not only prevents the open air from flowing into the storage portion 101C through such clearance but also prevents an inert gas pressed by the storage portion 101C from leaking to the outside.

The seal structure 130 includes an uneven portion 140 formed on the lower surface of the base 101A, a contact layer 150 formed on the surface of the uneven portion 140, a power supply layer 160, and an electrode layer 170 formed on the surface of the power supply layer 160.

The uneven portion 140 includes a first recessed portion 180 formed at a position spaced by a distance L1 (for example, 10 μm~100 μm) in the radial direction from the outer periphery of the through electrode 107 or from the inner wall of the through hole 120, and a second recessed portion 190 formed at a position spaced further by a given distance L2 (for example, 10 μm~100 μm) from the first recessed portion 180.

Also, between the first and second recessed portions 180 and 190, there is formed a projecting portion 200. The radial direction width L3 (for example, 10 μm~100 μm) of the projecting portion 200 is equal to an interval (a spaced distance) between the first and second recessed portion 180 and 190. Here, in the present embodiment, the respective distances L1, L2 and L3 are set equal to each other; however, these distances may also be set different from each other and the respective portions may also be disposed at irregular intervals.

In this manner, since the first recessed portion 180, projecting portion 200 and second recessed portion 190 are formed at different positions in the radial direction of the substrate from the outer periphery of the through electrode 107 or from the inner wall of the through hole 120, the connecting length L of the contact layer 150 with respect to the uneven portion 140 provides a length (L=R+4H) which is the sum of the radius R of the electrode layer 170 and a product obtained when the length H (the depth of first and second recessed portions 180 and 190) of a step portion in the radial direction and in the vertical direction is multiplied by 4. Therefore, since the connecting distance is extended by the number of step portions of the first and second recessed portions 180 and 190 than the radius R of the electrode 170, not only the connecting strength between the base 101A and electrode 170 is increased but also airtightness on the lower surface of the base 101A is enhanced greatly.

The depth H of the first and second recessed portions 180 and 190 is set for a given value (for example, 1 μm~50 μm) which corresponds to the radius R of the electrode layer 170 or the inside diameter of the through hole 120. The depths H of the first and second recessed portions 180 and 190 may be set equal to each other or may be set different from each other.

By the way, the positions and depths in the radial direction of the first and second recessed portions 180 and 190 are not limited to the above-mentioned numeral values that have been shown within the parentheses, but they may be respectively set for numeral values which are selected optionally according to the diameter of the through electrode 107 (the inside diameter of the through hole 120), the thickness of the substrate 101 or the base 101A, or the like.

Here, description will be given below of an example of a method for manufacturing the seal structure 130 for use in the above-mentioned package 100 with reference to FIGS. 2A to 2K, specifically, the steps (1 to 11) of the manufacturing method. However, in these figures, the portions, which have been described above, are given the same reference characters and thus, in some cases, the description thereof will be omitted.

Figure 2A:
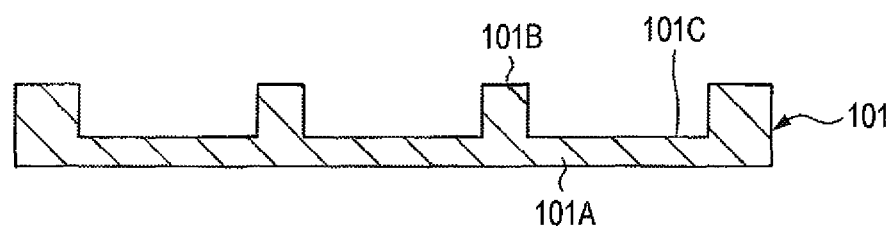
FIG. 2A is an explanatory view of one of steps (step 1) of a method for manufacturing the substrate according to the embodiment 1.

Firstly, in a step shown in FIG. 2A, the upper surface side of the substrate 101, which is made of Si or the like, is etched and patterned to thereby form the storage portion 101C for installing the light emitting element 102 (see FIG. 1). By the way, in the present embodiment, description will be given of a manufacturing method for etching the upper surface side of the substrate 101 to thereby form the storage portion 101C for storing the light emitting element 102; however, when the substrate 101 is small in thickness, there may also be employed a manufacturing method in which a wall for surrounding the periphery of the light emitting element 102 is formed on the surface of a substrate formed in a flat plate shape to thereby form a storage portion.

Figure 2B:
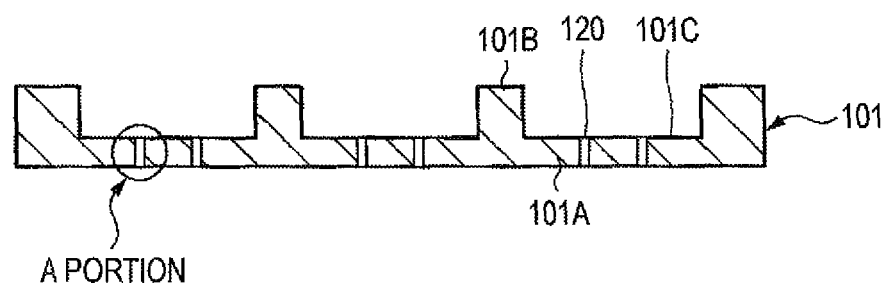
FIG. 2B is an explanatory view of one of steps (step 2) of the method for manufacturing the substrate according to the embodiment 1.

Next, in a step shown in FIG. 2B, the through hole 120 for forming the through electrode 107 is formed according to an etching operation in such a manner that the through hole 120 penetrates through the base 101A of the substrate 101 in the vertical direction thereof. Referring to the operation to be executed after the present step, description will be given below of steps of forming the seal structure 130 in the A portion that is shown in FIG. 2B so as to surround not only the through hole 120 but also its peripheral portion.

Figure 2C:
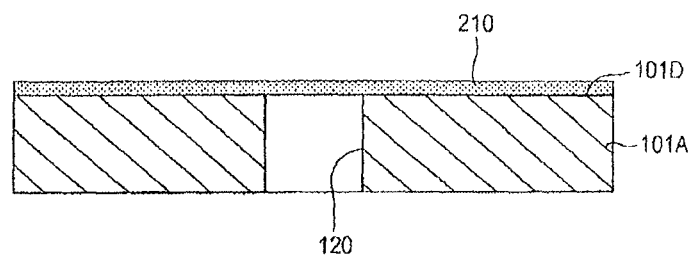
FIG. 2C is an explanatory view of one of steps of (step 3) of the method for manufacturing the substrate according to the embodiment 1.
Figure 2C:
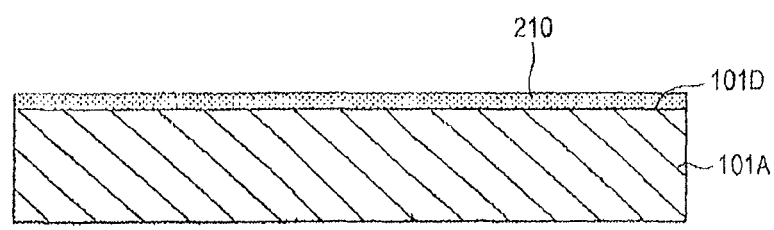

Next, in a step shown in FIG. 2C, a resist 210 such as a dry film resist is formed on the surface 101D of the lower surface side (in FIG. 2C, for convenience of explanation, the lower direction is shown in a reversed manner) of the base 101A.

Figure 2D:
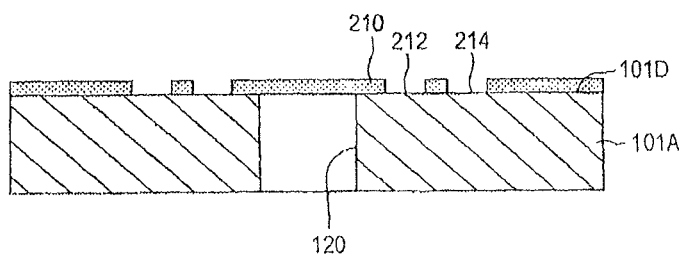
FIG. 2D is an explanatory view of one of steps (step 4) of a method for manufacturing the substrate according to the embodiment 1.
Figure 2D:
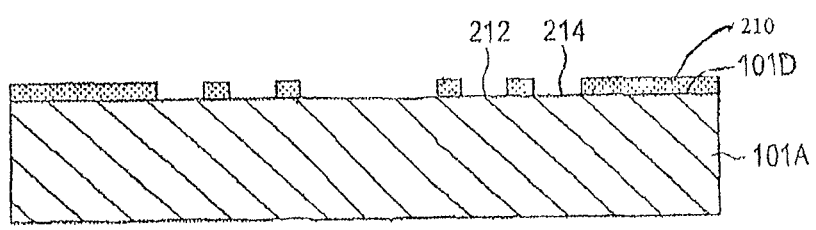

Next, in a step shown in FIG. 2D, the resist 210 is patterned (exposed and developed) and to thereby remove the portions thereof that correspond to the forming positions of the above-mentioned first and second recessed portions 180 and 190. Openings 212 and 214, which are formed in the resist 210 according to the patterning operation, respectively correspond to the outline shapes of the first and second recessed portions 180 and 190. And, the openings 212 and 214 are respectively formed at positions spaced in the radial direction by given distances from the through hole 120 in a concentric circle shape or in a square shape with the through hole 120 as the center thereof in such a manner as to surround the through hole 120.

Figure 2E:
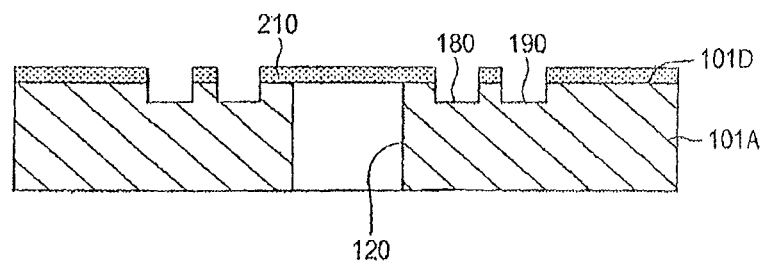
FIG. 2E is an explanatory view of one of steps (step 5) of the method for manufacturing the substrate according to the embodiment 1.
Figure 2E:
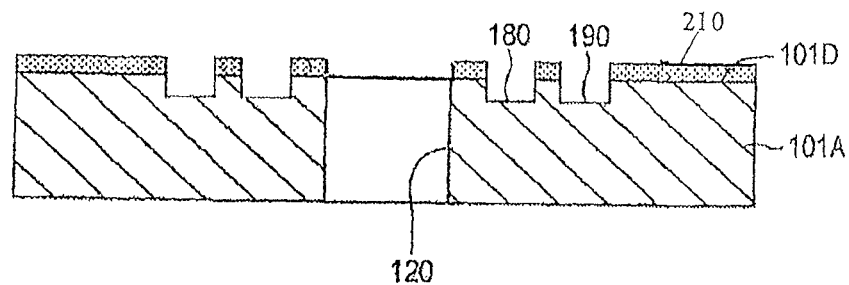

Next, in a step shown in FIG. 2E, an etching processing is enforced on the surface 101D of the base 101A that is exposed to the openings 212 and 214 of the resist 210 formed through the above-mentioned patterned processing, thereby forming ring-shaped grooves (ring shape when viewed from above) or square-frame-shaped grooves (square shape when viewed from above) respectively composed of the first and second recessed portions 180 and 190. In fact, since the etching processing is enforced in such a manner that the surface of the upper surface side of the base 101A is masked by the resist 210 or the like, on the surface 101D of the base 101A, there are etched and formed such first and second recessed portions 180 and 190 that correspond in shape to the patterned shapes (shapes when viewed from above) of the openings 212 and 214. Therefore, by changing the dimensions and intervals of the openings 212 and 214 of the resist 210, the first and second recessed portions 180 and 190 can be formed in arbitrary dimensions and intervals.

Figure 2F:
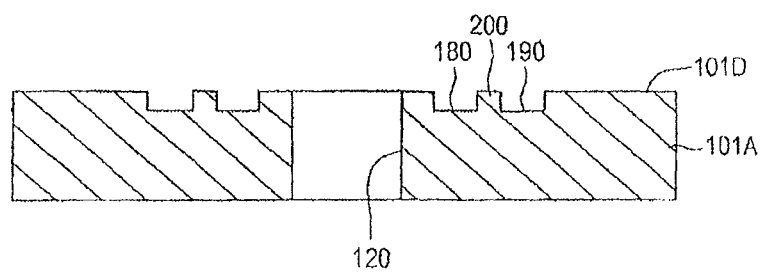
FIG. 2F is an explanatory view of one of steps (step 6) of the method for manufacturing the substrate according to the embodiment 1.

Next, in a step shown in FIG. 2F, the resist 210 is swollen and softened using a release solution and is then brushed, whereby the resist 210 is removed. As a result of this, there is produced a substrate 101 in which, on the surface 101D of the base 101A, there are formed a first recessed portion 180, a second recessed portion 190 and a projecting portion 200 respectively having a concentric circle shape or a square frame shape in such a manner that they surround the periphery of the through hole 120.

Figure 2G:
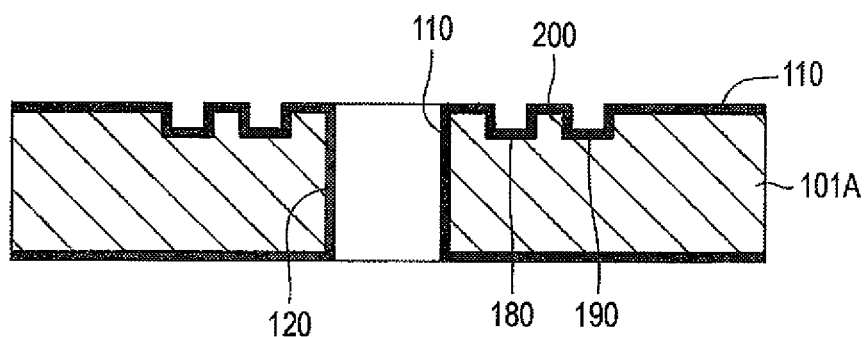
FIG. 2G is an explanatory view of one of steps (step 7) of the method for manufacturing the substrate according to the embodiment 1.

Next, in a step shown in FIG. 2G, on the surface of the substrate 101 including the lower surface of the base 101A (containing the surfaces of the first recessed portion 180, second recessed portion 190 and projecting portion 200), the inner wall surface of the storage portion 101C and the inner wall surface of the through hole 120, according to a thermal CVD method or the like, there is formed an insulting layer 110 which is composed of an oxide film (which is also referred to as a silicone oxide film or a thermal oxide film).

Figure 2H:
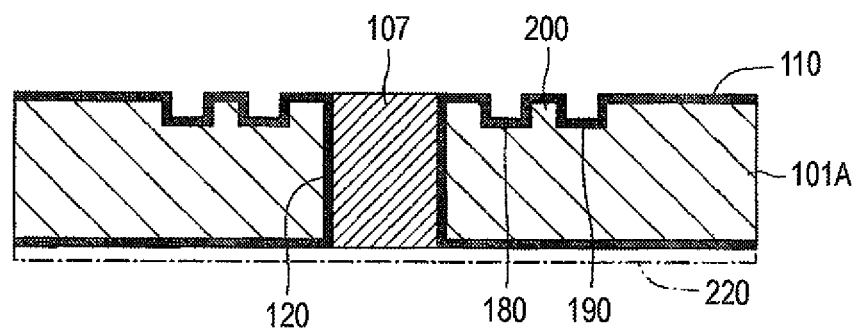
FIG. 2H is an explanatory view of one of steps (step 8) of the method for manufacturing the substrate according to the embodiment 1.

Next, in a step shown in FIG. 2H, for example, a conductive tape 220 (which is shown by a one-dot chained line in FIG. 2H) is bonded onto the lower surface side of the base 101A of the substrate 101. And, with the conductive tape 220 as a power supply layer, there is grown a Cu layer or a Ni layer in the through hole 120 according to an electrolytic plating method or the like. Owing to this, in the through hole 120, there is formed a through electrode 107 which is obtained by depositing Cu or Ni. And, after the formation of the through electrode 107, the conductive tape 220 is peeled and removed from the lower surface of the base 101A.

Figure 2I:
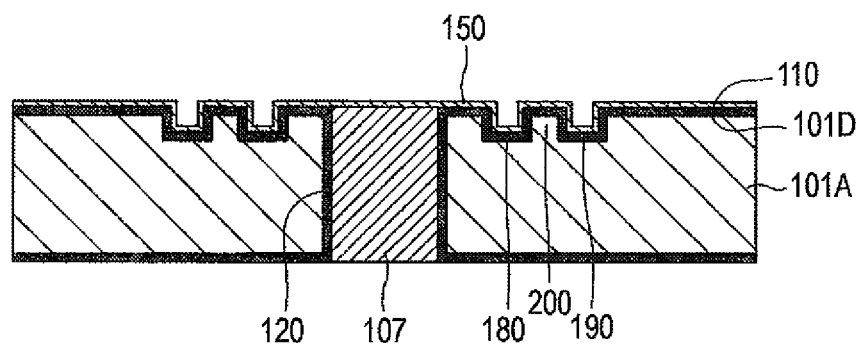
FIG. 2I is an explanatory view of one of steps (step 9) of the method for manufacturing the substrate according to the embodiment 1.

Next, in a step shown in FIG. 2I, according to a PVD (Physical Vapor Deposition) method or a CVD (Chemical Vapor Deposition) method, a close contact metal (for example, Ti, Ta or Cr) having a good close contact property with respect to the insulating layer 110 is deposited on the entire surface 101D of the base 101A including the first recessed portion 180, second recessed portion 190, projecting portion 200 and through electrode 107 to thereby form a close contact layer 150 on the surface 101D.

Thus, the surface of the close contact layer 150 has a distance which is the sum of the radial direction (peripheral direction) length from the inner wall of the through hole 120 (or the outer periphery of the through electrode 107) to the peripheral edge portion of the substrate and the depths (or the heights) of the first recessed portion 180, second recessed portion 190 and projecting portion 200 in the vertical direction. Since the close contact layer 150 is connected to the surfaces (including the radial direction and vertical direction wall surfaces) of the first recessed portion 180, second recessed portion 190, and projecting portion 200 in this manner, the close contact between the close contact layer 150 and insulating layer 110 is enhanced, whereby the close contact layer 150 can be firmly placed on top of the insulating layer 110.

Figure 2J:
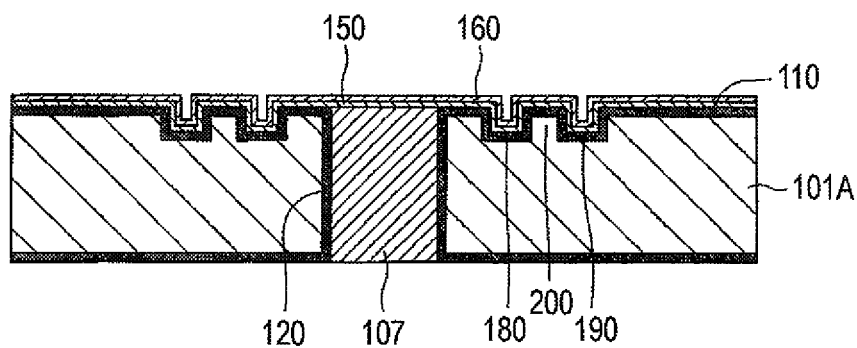
FIG. 2J is an explanatory view of one of steps (step 10) of the method for manufacturing the substrate according to the embodiment 1.

Next, in a step shown in FIG. 2J, according to the PVD method or an electroless plating method, a power supply layer 160 made of, for example, Cu is formed on the surface of the close contact layer 150. Since the power supply layer 160 is connected not only to the close contact layer 150 having a high close contact property but also to the surfaces (including the vertical direction wall surfaces) of the first recessed portion 180, second recessed portion 190 and projecting portion 200, the connecting distance thereof is extended greatly when compared with a case where it is connected to a flat surface to thereby enhance the degree of the close contact between the close contact layer 150 and power supply layer 160, so that the power supply layer 160 can be placed onto the close contact layer 150 firmly.

Figure 2K:
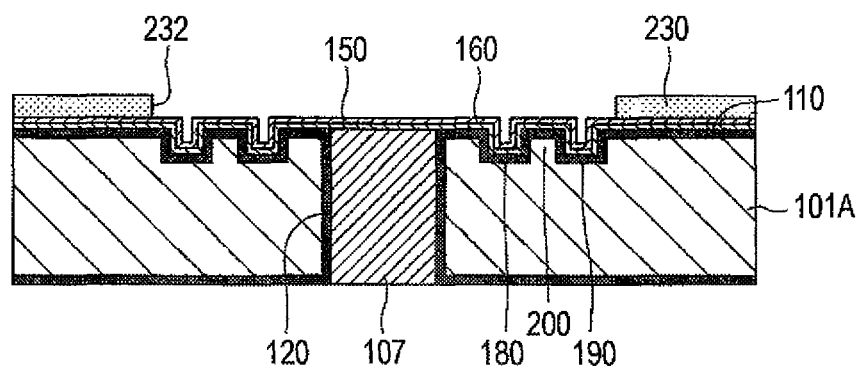
FIG. 2K is an explanatory view of one of steps (step 11) of the method for manufacturing the substrate according to the embodiment 1.

Next, in a step shown in FIG. 2K, a resist 230 is formed on the surface of the power supply layer 160, and the resist 230 is patterned (exposed and developed) to remove the portion thereof that corresponds to the forming position of the above-mentioned electrode layer 170, thereby forming an electrode forming opening 232. The electrode forming opening 232 is formed in a circular or square shape with the axis of the through electrode 107 as a center thereof in such a manner that the first recessed portion 180, second recessed portion 190 and projecting portion 200 are exposed.

Figure 2L:
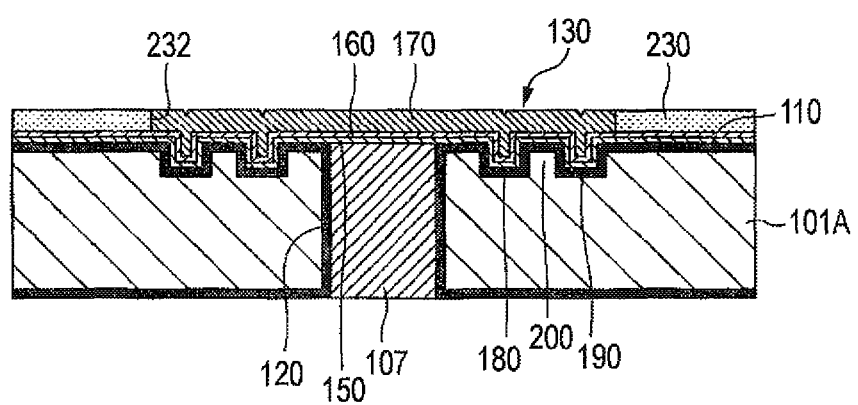
FIG. 2L is an explanatory view of one of steps (step 12) of the method for manufacturing the substrate according to the embodiment 1.

Next, in a step shown in FIG. 2L, an electrolytic plating processing is enforced on the surface of the power supply layer 160 by supplying power from the power supply layer 160 according to a semi-additive method, whereby an electrode layer 170 made of a Cu plated layer is formed on the surface of the power supply layer 160. Also, the electrode layer 170 may also be formed by other methods such as a subtractive method than the semi-additive method.

Thus, since the electrode layer 170 is connected to the surfaces of the first recessed portion 180, second recessed portion 190 and projecting portion 200 through the insulating layer 110, close contact layer 150 and power supply layer 160, the close contact between the electrode layer 170 and the base 101A is enhanced, whereby the electrode layer 170 can be placed on top of the base 101A firmly.

Figure 2M:
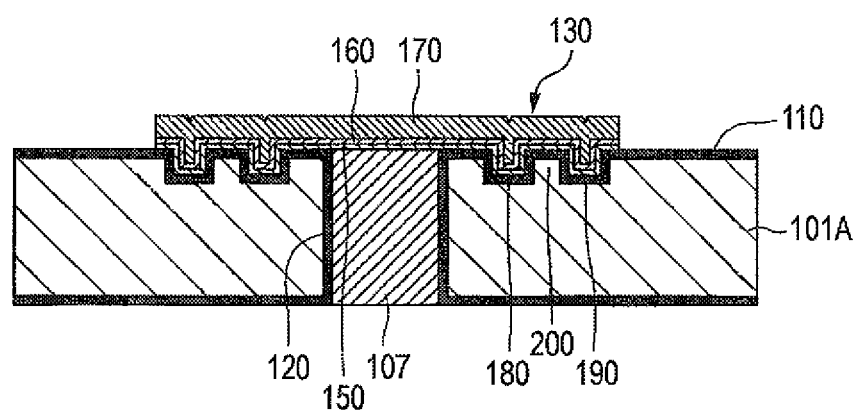
FIG. 2M is an explanatory view of one of steps (step 13) of the method for manufacturing the substrate according to the embodiment 1.

Next, in a step shown in FIG. 2M, the resist 230 is removed and, after then, by etching, there are removed the close contact layer 150 and power supply layer 160 except for a portion which exist in the area of the electrode layer 170 (the outside area of the electrode layer 170). This completes the seal structure 130 shown in FIG. 1.

In this manner, the seal structure 130 is structured such that the insulating layer 110, close contact layer 150, power supply layer 160 and electrode layer 170 are placed on the surfaces (including the vertical direction wall surfaces) of the first recessed portion 180, second recessed portion 190 and projecting portion 200. Therefore, even when there is generated a small clearance between the inner wall of the through hole 120 and the outer periphery of the through electrode 107, the airtightness of the periphery of the through electrode 107 can be enhanced as well as the connecting strength can be enhanced when compared with a flat surface structure.

Now, description will be given below of a procedure (the steps 1~9 thereof) for mounting the light emitting element 102 into the storage portion 101C of the substrate 101 having the above-mentioned seal structure 130 with reference to FIGS. 3A to 3I. However, in the following figures, the portions, which have been described above, are given the same reference characters and thus, in some cases, the description thereof will be omitted.

Figure 3A:
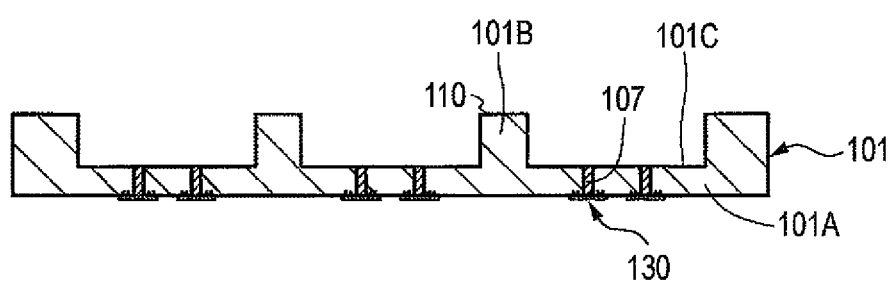
FIG. 3A is an explanatory view of one of steps (step 1) of a method for mounting a light emitting element into the substrate according to the embodiment 1.

Firstly, in a step shown in FIG. 3A, on the lower surface side of the base 101A, there are provided airtightness-secured seal structures 130 in the peripheries of the respective through electrodes 107 which are respectively disposed in each of a plurality of storage portions 101C.

Figure 3B:
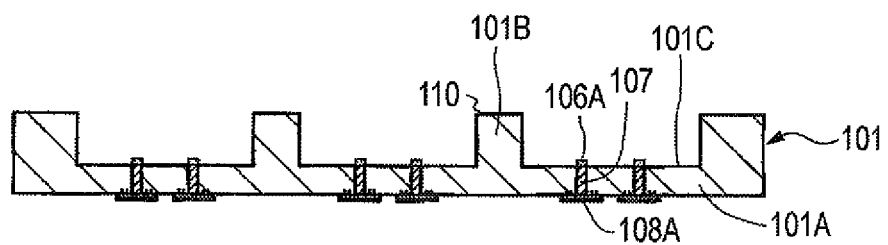
FIG. 3B is an explanatory view of one of steps (step 2) of the method for mounting a light emitting element into the substrate according to the embodiment 1.

Next, in a step shown in FIG. 3B, according to a plating method or the like, there are formed connecting layers 106A and 108A which are respectively made of Ni/Au or the like. In this case, the connecting layers 106A are respectively formed on the upper end side (on the storage portion 101C side) of the corresponding through electrodes 107. Also, the connecting layers 108A are respectively formed on the opposite side (on the lower end side) of the corresponding through electrodes 107.

Figure 3C:
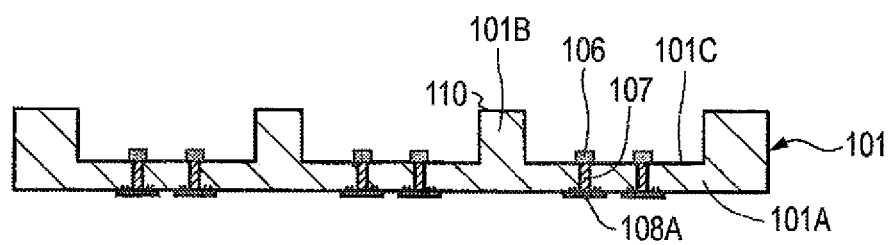
FIG. 3C is an explanatory view of one of steps (step 3) of the method for mounting a light emitting element into the substrate according to the embodiment 1.

Next, in a step shown in FIG. 3C, on each of the connecting layers 106A, there is formed a bump 106 by bonding a wire made of Au or the like to the connecting layer 106A. By the way, in FIG. 3C and its following figures, the illustration of the connecting layers 106A is omitted.

Figure 3D:
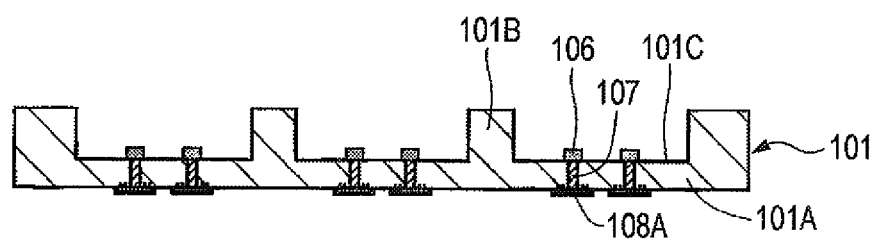
FIG. 3D is an explanatory view of one of steps (step 4) of the method for mounting a light emitting element into the substrate according to the embodiment 1.

Next, in a step shown in FIG. 3D, the insulating layers 110 formed on the upper end side surface of the wall portions 101B in the periphery of the storage portion 101C are removed according to a mask etching method or the like. To the upper ends of the wall portions 101B, from which the insulating layer 110 has been removed in the present step, there can be connected glass-made covers in a step to be executed later.

Figure 3E:
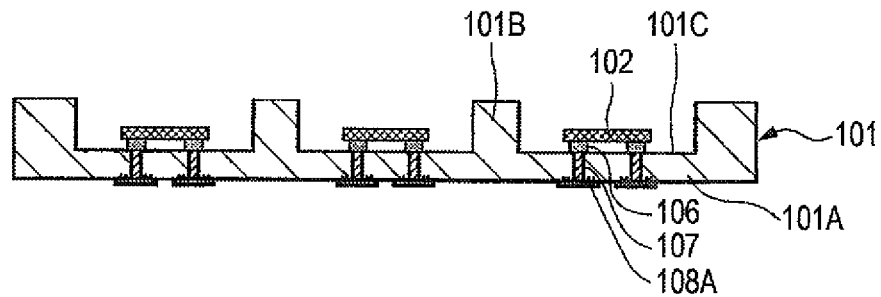
FIG. 3E is an explanatory view of one of steps (step 5) of the method for mounting a light emitting element into the substrate according to the embodiment 1.

Next, in a step shown in FIG. 3E, a light emitting element 102 is disposed within each of the storage portions 101C. In this case, according to a thermal pressure connection method or an ultrasonic connection method, the electrode of the light emitting element 102 and bump 106 are electrically connected together, whereby the light emitting element 102 and through electrode 107 can be electrically connected together through the bump 106.

Figure 3F:
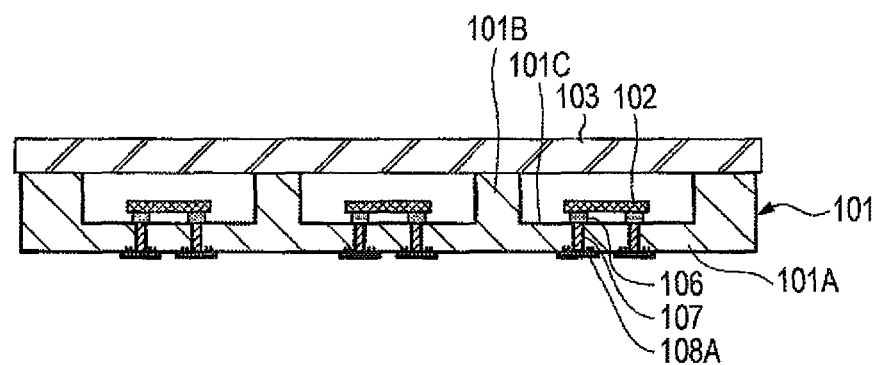
FIG. 3F is an explanatory view of one of steps (step 6) of the method for mounting a light emitting element into the substrate according to the embodiment 1.

Next, in a step shown in FIG. 3F, a flat-plate-shaped light transmissible cover 103 made of borosilicate glass or the like is connected to the upper end face of the wall portion 101B of the substrate 101 according to an anode bonding method or the like, thereby forming a structure which seals the light emitting element 102 within the storage portion 101C of the substrate 101. In this case, in the anode bonding method, there is applied a high voltage into between the cover 103 and substrate 101 to increase the temperatures of the cover 103 and substrate 101, thereby connecting together the cover 103 and the upper end face of the wall portion 101B.

Owing to execution of the above-mentioned anode bonding, Si constituting the substrate and oxygen contained in the glass forming the cover are united together, resulting in the connection that is stable and has a good connecting force. Also, differently from the connection that is obtained using resin material, there is little possibility of generation of such gas or impurities that contaminate the space for sealing the light emitting element 102.

Figure 3G:
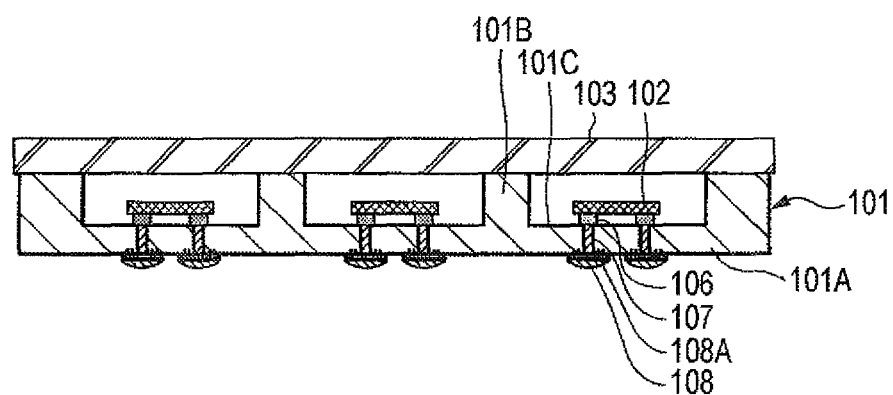
FIG. 3G is an explanatory view of one of steps (step 7) of the method for mounting a light emitting element into the substrate according to the embodiment 1.

Next, in a step shown in FIG. 3G, a solder bump 108 is formed in the connecting layer 108A.

Figure 3H:
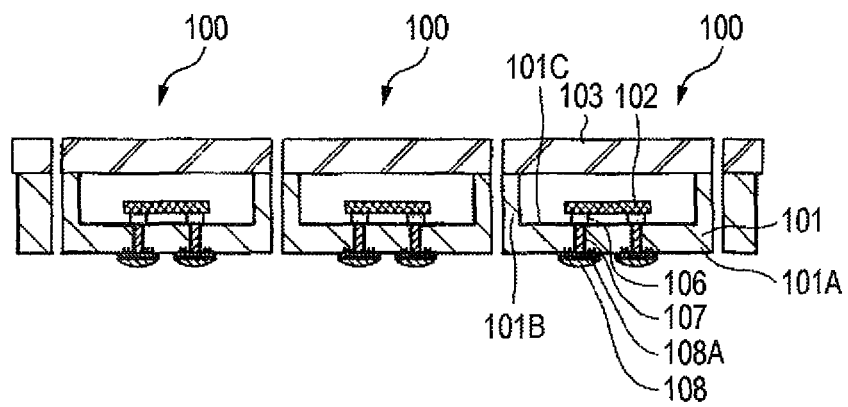
FIG. 3H is an explanatory view of one of steps (step 8) of the method for mounting a light emitting element into the substrate according to the embodiment 1.

After then, in a step shown in FIG. 3H, the substrate 101 and cover 103 are diced and cut off into individual pieces, thereby completing the above-mentioned packages 100 (see FIG. 1).

Embodiment 2

Figure 4:
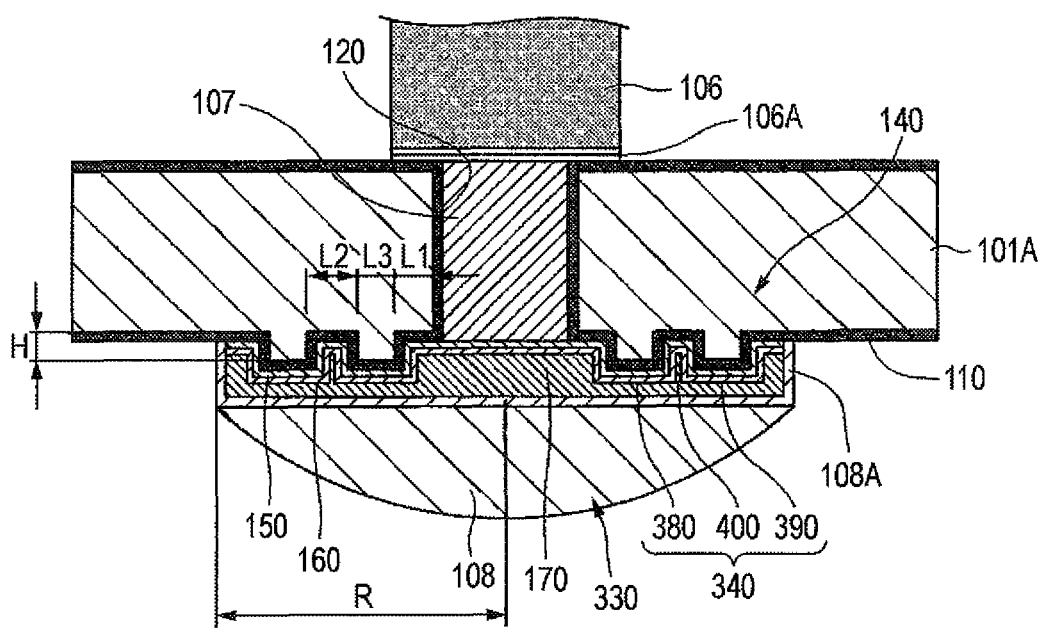
FIG. 4 is a typical longitudinal section view of a seal structure used in a substrate according to an embodiment 2.

Now, FIG. 4 is a longitudinal section view which typically shows a seal structure used in a substrate according to an embodiment 2 of the invention. Description will be given below of the embodiment 2 of the seal structure used in the package 100 with reference to FIG. 4. In the following figures, the same parts as those that have been described hereinbefore are given the same designations and thus, in some cases, the description thereof will be omitted.

As shown in FIG. 4, a seal structure 330 according to the embodiment 2 includes an uneven portion 340 formed on the lower side surface of the base 101A, a close contact layer 150 formed on the surface of the uneven portion 340, a power supply layer 160 formed on the close contact layer 150 and an electrode layer 170 formed on the surface of the power supply layer 160.

The uneven portion 340 includes a first projecting portion 380 formed at a position spaced by a given distance L1 (for example, 10 µm~100 µm) in the radial direction with respect to the outer periphery of the through electrode 107 or the inner wall of the through hole 120, and a second projecting portion 390 formed at a position spaced by a given distance L2 (for example, 10 µm~100 µm) further outwardly from the first projecting portion 380.

Also, between the first and second projecting portions 380 and 390, there is formed a recessed portion 400. The width L3

(for example, 10 μm~100 μm) in the radial direction of the recessed portion 400 is equal to the interval (spaced distance) between the first and second projecting portions 380 and 390. By the way, in the present embodiment, the respective distances L1, L2 and L3 are set to be equal to each other. However, they may also be set different from each other and thus the projecting and recessed portions may also be disposed at irregular intervals.

In this manner, since the first projecting portion 380, recessed portion 400 and second projecting portion 390 are formed at different positions in the radial direction from the outer periphery of the through electrode 107 or the inner wall of the through hole 120, the connection length L of the close contact layer 150 with respect to the uneven portion 340 provides the value (L=R+4H) that is obtained as the sum of the radius R of the electrode layer 170 and the product of four and the length H of the step portions in the radial and vertical directions (the first and second projecting portions 380 and 390). Therefore, the connection length is extended by the number of steps of the first and second projecting portions 380 and 390 over the radius R of the electrode layer 170. This not only enhances the connection strength between the base 101A and electrode layer 170 but also greatly enhances the airtightness of the lower side surface of the base 101A.

The heights H of the first and second projecting portions 380 and 390 are respectively set for given values ((for example, 1 μm~10 μm) which correspond to the radius R of the electrode layer 170 or the inside diameter of the through hole 120. The heights H of the first and second projecting portions 380 and 390 may be set equal to each other or may be set different from each other.

By the way, the radial-direction positions of the first and second projecting portions 380, 390 as well as the heights thereof are not limited to the numerical values that are stated in the above-mentioned parentheses but may be set for arbitrary values depending on the diameter of the through electrode 107 (the inside diameter of the through hole 120), the thickness of the substrate 101 or base 101A, and the like.

Next, description will be given below of the steps (1 to 9) of a method for manufacturing the above-mentioned seal structure 330 with reference to FIGS. 5A to 5I. By the way, the respective steps shown in FIGS. 5A to 5I correspond to another embodiments of the steps previously described in FIGS. 2C to 2K. In the following figures, the same parts as those that have been described hereinbefore are given the same designations and thus, in some cases, the description thereof will be omitted.

Figure 5A:
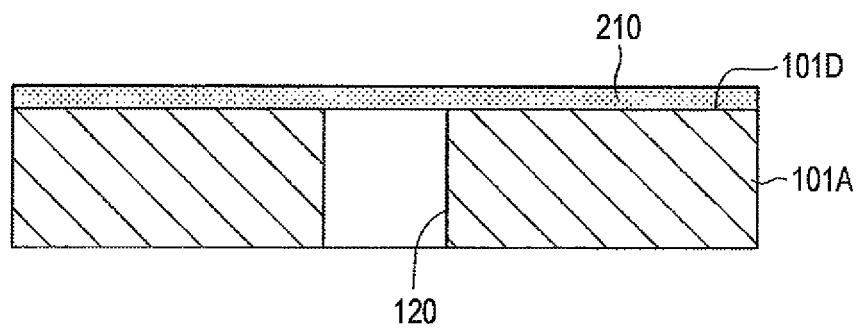
FIG. 5A is an explanatory view of one of steps (step 1) of a method for manufacturing the substrate according to the embodiment 2.

Firstly, in a step shown in FIG. 5A, on the surface 101D of the lower surface side (in FIG. 5A, for convenience of explanation, the downward direction is shown in a reversed manner) of the base 101A, there is formed a resist 210 which is made of a dry film resist or the like.

Figure 5B:
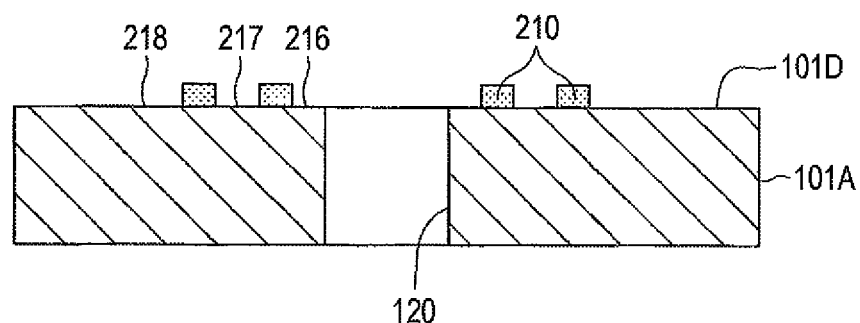
FIG. 5B is an explanatory view of one of steps (step 2) of the method for manufacturing the substrate according to the embodiment 2.

Next, in a step shown in FIG. 5B, the resist 210 is patterned (exposed and developed) and is thus removed from the other portions of the surface 101D than the portions thereof corresponding to the forming positions of the above-mentioned first and second projecting portions 380 and 390, whereby the resist 210 is left only in the portions that correspond to the forming portions of the first and second projecting portions 380 and 390. The patterns of the resists 210 left on the surface 101D of the base 101A respectively correspond to the outer shapes of the first and second projecting portions 380 and 390. And, these patterns are respectively formed at positions spaced in the radial direction by a given distance from the through hole 120, while they have a concentric circle shape or a square frame shape with the through hole 120 as the center thereof in such a manner that they surround the through hole 120.

Figure 5C:
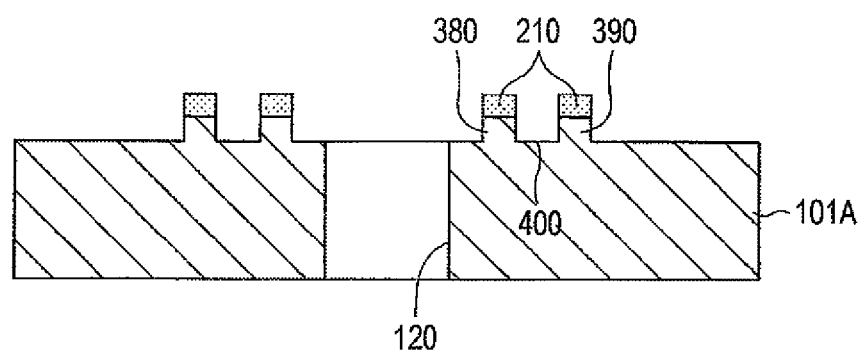
FIG. 5C is an explanatory view of one of steps (step 3) of the method for manufacturing the substrate according to the embodiment 2.

Next, in a step shown in FIG. 5C, there is enforced an etching processing on the surface 101D of the base 101A exposed in openings 216, 217 and 218 which are respectively formed between the patterned resists 210. Owing to this, the portions of the surface 101D that the resists 210 are not formed on are removed. As a result of this, there are formed a ring-shaped projecting portion (a ring shape when viewed from above) or a square-frame-shaped projecting portion (a square shape when viewed from above) which is composed of the first and second projecting portions 380 and 390, and a recessed portion 400.

Actually, the etching processing is enforced in such a state where the upper surface side surface of the base 101A is masked by the resists 210 or the like. Thus, in the etching processing, there are etched the periphery of the through hole 120 and the recessed portion 400 situated outside such periphery, both of which correspond to the pattern shapes (when viewed from above) of the openings 216, 217 and 218 of the resists 210. Therefore, by changing the respective dimensions of the openings 216, 217 and 218 of the resists 210 and the spaced distances thereof, the first and second projecting portions 380 and 390 can be formed in arbitrary dimensions and at arbitrary intervals.

Figure 5D:
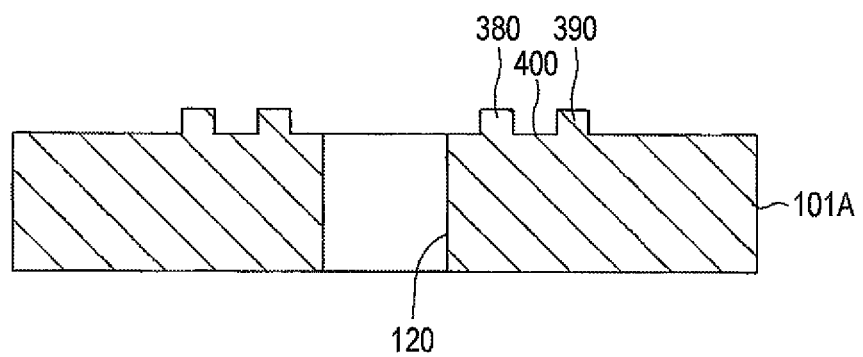
FIG. 5D is an explanatory view of one of steps (step 4) of the method for manufacturing the substrate according to the embodiment 2.

Next, in a step shown in FIG. 5D, the resists 210 are swollen and softened using a release solution and, after then they are brushed, whereby the resists 210 are removed. As a result of this, there is obtained a substrate 101 structured such that, on the surface 101D of the base 101A, there are formed the first projecting portion 380, second projecting portion 390 and recessed portion 400 respectively having a concentric circle shape or a square frame shape in such a manner as to surround the periphery of the through hole 120.

Figure 5E:
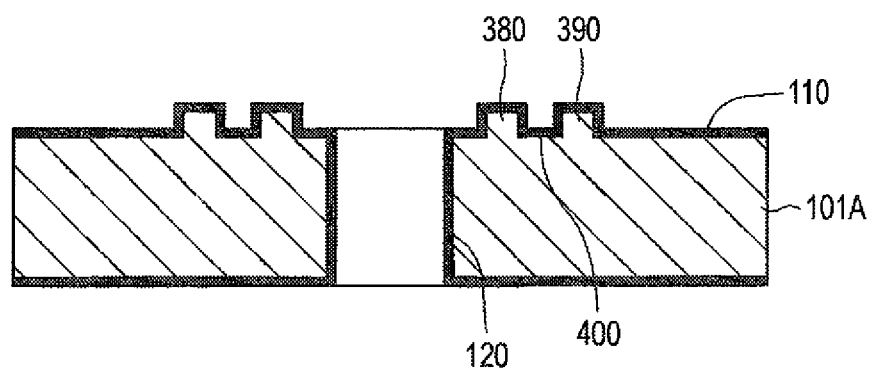
FIG. 5E is an explanatory view of one of steps (step 5) of the method for manufacturing the substrate according to the embodiment 2.

Next, in a step shown in FIG. 5E, on the lower surface of the base 101A (including the surfaces of the first projecting portion 380, second projecting portion 390 and recessed portion 400) as well as on the surface of the substrate 101 including the inner wall surface of the storage portion 101C and the inner wall surface of the through hole 120, there is formed an insulating layer 110 made of an oxide film (which is also referred to as a silicone oxide film or a thermal oxide film) according to a thermal CVD method or the like.

Figure 5F:
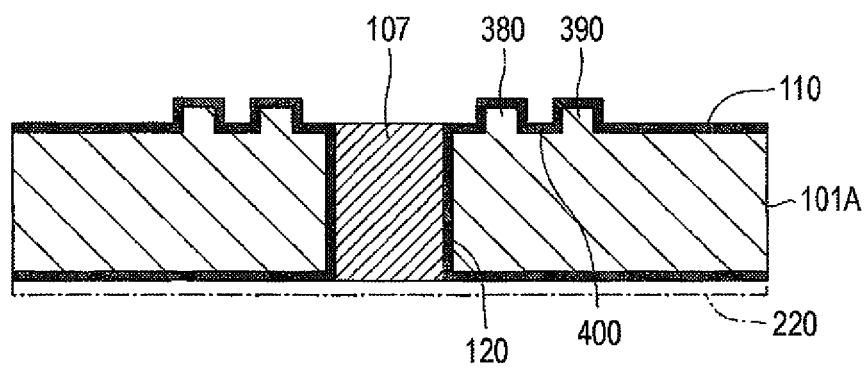
FIG. 5F is an explanatory view of one of steps (step 6) of the method for manufacturing the substrate according to the embodiment 2.

Next, in a step shown in FIG. 5F, a conductive tape 220 (which is shown by a one-dot chained line in FIG. 5F) is bonded to, for example, the lower surface side of the base 101A of the substrate 101. And, with the conductive tape 220 as the power supply layer, there is grown a Cu layer or a Ni layer in the through hole 120 according to an electrolytic plating method. As a result of this, in the through hole 120, there is provided a through electrode 107 that is obtained through the deposition of Cu or Ni. After provision of the through electrode 107 in the through hole 120, the conductive tape 220 is separated and removed from the lower surface of the base 101A.

Figure 5G:
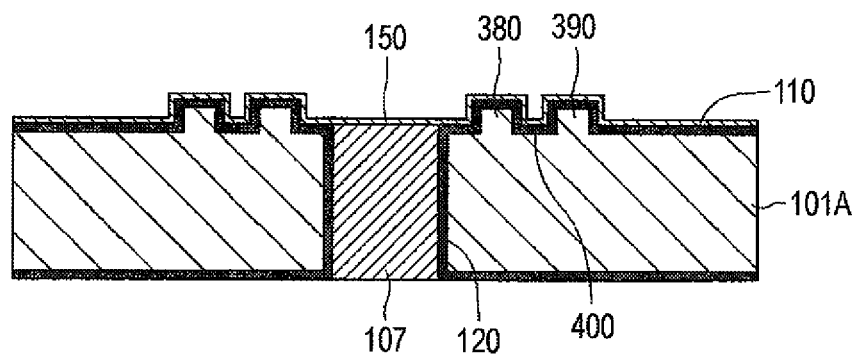
FIG. 5G is an explanatory view of one of steps (step 7) of the method for manufacturing the substrate according to the embodiment 2.

Next, in a step shown in FIG. 5G, according to a PVD (Physical Vapor Deposition) method or a CVD (Chemical Vapor Deposition) method, a close contact metal (for example, Ti, Ta, Cr or the like) having a good close contact property with respect to the insulating layer 110 is deposited on the entire surface of the base 101A including the surfaces of the first projecting portion 380, second projecting portion 390, recessed portion 400 and through electrode 107 to thereby form a close contact layer 150 thereon.

Thus, the surface of the close contact layer 150 has a distance corresponding to the sum of a radial direction (peripheral direction) length from the inner wall of the through hole 120 (or the outer periphery of the through electrode 107) to the peripheral edge surface of the substrate and the vertical direction depths (or heights) of the first projecting portion 380, second projecting portion 390 and recessed portion 400. That is, since the close contact layer 150 is connected to the surfaces (including the radial direction and vertical direction wall surfaces) of the first projecting portion 380, second projecting portion 390 and recessed portion 400 in this manner, the airtightness between the close contact layer 150 and insulating layer 110 is enhanced, whereby the close contact layer 150 can be formed firmly on the insulating layer 110.

Figure 5H:
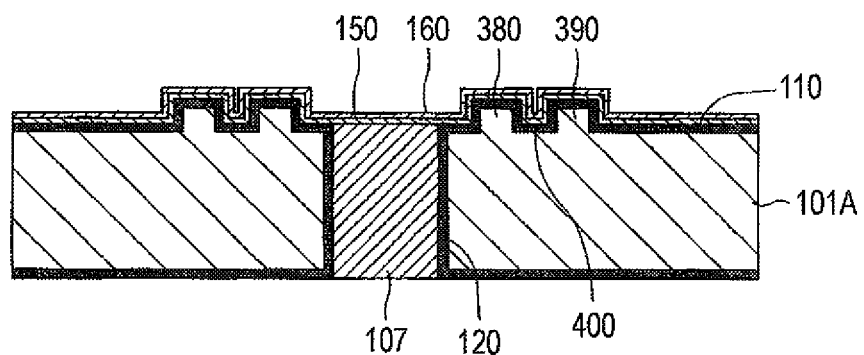
FIG. 5H is an explanatory view of one of steps (step 8) of the method for manufacturing the substrate according to the embodiment 2.

Next, in a step shown in FIG. 5H, according to the PVD method or an electroless plating method, on the surface of the close contact layer 150, there is formed a power supply layer 160 which is made of Cu or the like. Since the power supply layer 160 is sealed not only to the close contact layer 150 having a high close contact property but also to the surfaces (including the vertical direction wall surfaces) the first projecting portion 380, second projecting portion 390 and recessed portion 400, the connecting distance of the power supply layer 160 is extended greatly when compared with a case where it is connected to a flat surface. Owing to this, the airtightness between the close contact layer 150 and power supply layer 160 is enhanced, and thus the power supply layer 160 can be firmly formed on the close contact layer 150.

Figure 5I:
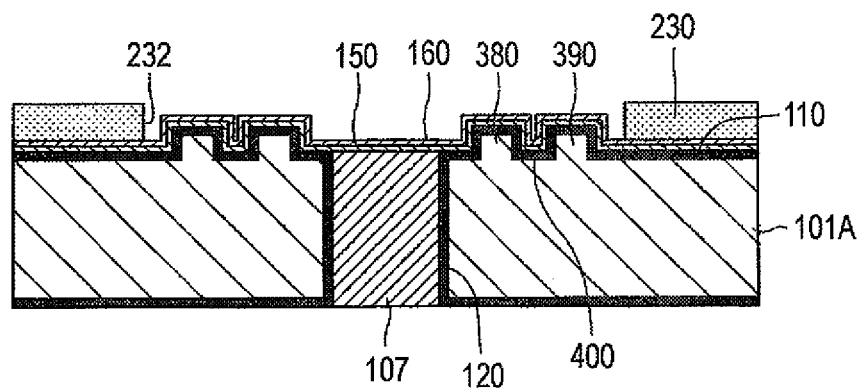
FIG. 5I is an explanatory view of one of steps (step 9) of the method for manufacturing the substrate according to the embodiment 2.

Next, in a step shown in FIG. 5I, there is formed a plated resist 230 on the surface of the power supply layer 160; and then, the plated resist 230 is patterned (exposed and developed) to remove the portion of the plated resist 230 that corresponds to the forming portion of the above-mentioned electrode layer 170, thereby forming an electrode layer forming opening 232. The electrode layer forming opening 232 is formed in a circular or square shape (when viewed from above) with the axis of the through electrode 107 as the center thereof in order that the first projecting portion 380, second projecting portion 390 and recessed portion 400 can be exposed.

Figure 5J:
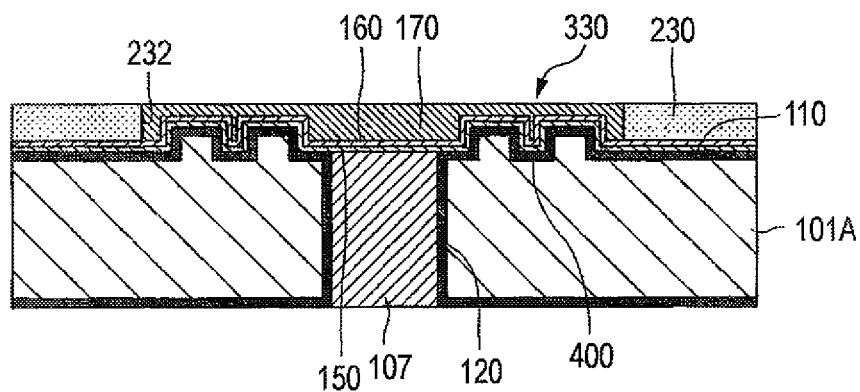
FIG. 5J is an explanatory view of one of steps (step 10) of the method for manufacturing the substrate according to the embodiment 2.

Next, in a step shown in FIG. 5J, according to a semi-additive method, there is enforced an electrolytic plating using power supply from the power supply layer 160, whereby, on the surface of the power supply layer 160, there is formed an electrode layer 170 which is made of a Cu plated layer. Alternatively, the electrode layer 170 may also be formed according to other methods such as a subtractive method than the semi-additive method. In this manner, since the electrode layer 170 is connected through the close contact layer 150 and power supply layer 160 to the surfaces of the first projecting portion 380, second projecting portion 390 and recessed portion 400, the connecting distance thereof is extended greatly when compared with a case where it is connected to a flat surface. Owing to this, the airtightness between the electrode layer 170 and power supply layer 160 is enhanced, and thus the electrode layer 170 can be firmly formed on the power supply layer 160.

Figure 5K:
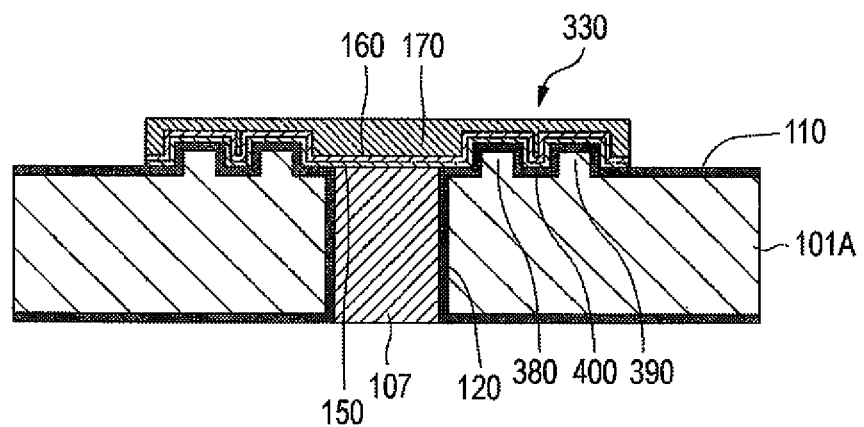
FIG. 5K is an explanatory view of one of steps (step 11) of the method for manufacturing the substrate according to the embodiment 2.

Next, in a step shown in FIG. 5K, the resist 230 is removed and, next, the close contact layer 150 and power supply layer 160 existing in the other portion of the electrode layer 170 (the outer portion of the electrode layer 170) than the lower portion thereof are removed by etching. This completes the seal structure 330 shown in FIG. 4.

As described above, in the seat structure 330, the insulating layer 110, close contact layer 150, power supply layer 160 and electrode layer 170 are formed on top of each other on the surfaces (including the wall surfaces in the vertical direction) of the first projecting portion 380, second projecting portion 390 and recessed portion 400. Therefore, even when there is generated a fine clearance between the inner wall of the through hole 120 and the outer periphery of the through electrode 107, not only the airtightness in the periphery of the through electrode 107 can be enhanced but also the connecting strength can be enhanced more when compared with a case where a flat surface is used.

Embodiment 3

Figure 6:
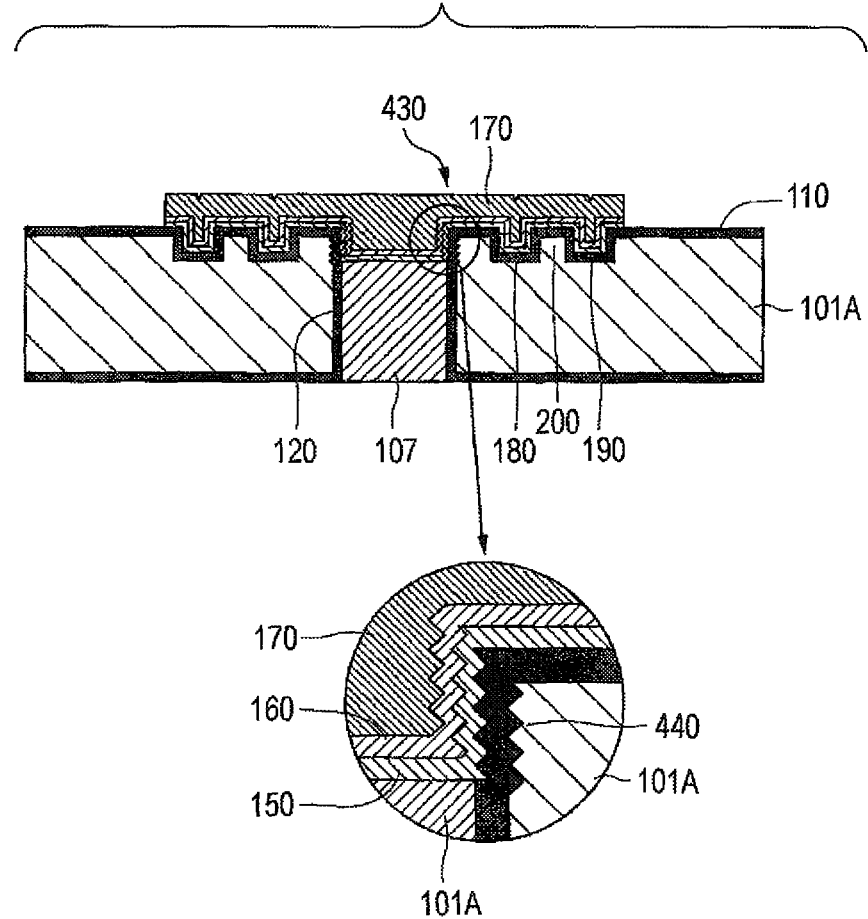
FIG. 6 is a typical longitudinal section view of a seal structure used in a substrate according to an embodiment 3.

FIG. 6 is a longitudinal section view which typically shows a seal structure used in a substrate according to an embodiment 3 of the invention. Now, description will be given below of the embodiment 3 of a seal structure used in the package 100 with reference to FIG. 6. In the figures to be discussed below, the same parts as those that have been described hereinbefore are given the same designations and thus, in some cases, the description thereof will be omitted.

As shown in FIG. 6, in a seal structure 430 according to the embodiment 3 of the invention, in the inner wall of an opening formed in the through hole 120, there is formed a rough surface 440 which is composed of a small uneven portion. To form this rough surface 440, in the step shown in FIG. 2B according to the above-mentioned embodiment 1, after the base 101A of the substrate 101 is etched to thereby form the through hole 120 which penetrates through the base 101A in the vertical direction thereof, the entire surface of the inner wall of the through hole 120 or a portion (opening end side) of the inner wall of the through hole 120 is half etched, that is, a roughening processing is enforced on the base 101A.

After then, through the steps respectively shown in FIGS. 2G, 2I, 2J and 2L according to the above-mentioned embodiment 1, an insulating layer 110, a close contact layer 150 and a power supply layer 160 are respectively formed on the entire surface of the base 101A and the inner wall (including the rough surface 440) of the through hole 120, and an electrode layer 170 is formed on the electrode layer forming opening 232 of the resist 230. Also, when forming a through electrode 107 according to the step shown in FIG. 2H, there is formed the through electrode 107 in such a manner that, by shortening the electrolytic plating time, one end of the through electrode 107 is situated lower than the opening end of the through hole 120 so as to allow the exposure of the inner wall of the one end side of the opening of the through hole 120.

Further, preferably, the close contact layer 150 may be formed on the surface of the rough surface 440 with a uniform film thickness. This close contact layer 150 may be preferably formed according to, for example, an ALD (Atomic Layer Deposition) method which is capable of forming a uniform thin film at a molecular level. And, on the surface of the close contact layer 150 including a small uneven portion, preferably, there may be formed such a power supply layer 160 that has a uniform film thickness.

Further, there is enforced an electrolytic plating processing according to a semi-additive method by supplying power from the power supply layer 160 to thereby form an electrode layer 170 made of a Cu plated layer on the surface of the power supply layer 160. Alternatively, the electrode layer 170 may also be formed according to other methods such as a subtractive method than the semi-additive method.

Accordingly, in the present embodiment, similarly to the previous embodiments 1 and 2, the electrode layer 170 not only is formed on the first and second recessed portions 180 and 190 according to the embodiment 1 (or on the first and second projecting portions 380 and 390 according to the embodiment 2) but also is connected through the close contact layer 150 and power supply layer 160 to the surface of the rough surface 440 which is formed on the inner wall of the one end side of the opening of the through hole 120 and includes the small uneven portion. Therefore, the airtightness between the electrode layer 170 and power supply layer 160 is enhanced and thus the electrode layer 170 can be firmly formed on the power supply layer 160.

Also, according to the embodiment 3, not only the rough surface 440 but also the first and second recessed portions 180 and 190 according to the embodiment 1 or the first and second projecting portions 380 and 390 according to the embodiment 2 are combined with the inner wall of the through hole 120. Owing to this, the airtightness between the close contact layer 150, power supply layer 160 and electrode layer 170 can be further enhanced than the previously-mentioned embodiments 1 and 2 and thus the electrode layer 170 can be firmly formed on the base 101A.

In the respective embodiments described heretofore, description has been given of an example in which the light emitting element 102 is mounted within the storage portion 101C of the substrate 101. However, this is not limitative but it goes without saying that the invention can also apply to a substrate seal structure in which other element (such as a MEMS element) than the light emitting element 102 is mounted.

Also, in the above-mentioned embodiments, description has been given of a structure in which the first and second recessed portions 180 and 190 or the first and second projecting portions 380 and 390 are formed only on the lower surface side of the substrate 101. However, this is not limitative but, of course, the first and second recessed portions 180 and 190 or the first and second projecting portions 380 and 390 may also be formed on the upper surface side and lower surface side of the substrate 101 (on both sides of the through electrode 107). And, the rough surface 440 according to the embodiment 3, alternatively, may also be formed on the opening inner walls on both sides of the through electrode 107; and, the electrode layer 170 may also be formed on the rough surface 440 through the insulating layer 110, close contact layer 150 and power supply layer 160.

Also, in the above-mentioned respective embodiments, description has been given of an example where the through electrode 107 is provided on the substrate 101 in which the light emitting element 102 is mounted. However, the invention is not limited to this but, for example, there may also be employed a structure in which the through electrode 107 is provided on a silicone substrate including an integrated circuit, the rough surface 440 is formed in the seal structure 130 according to the embodiment 1, or in the seal structure 330 according to the embodiment 2, or in the inner wall of the opening of the through hole 120, and the electrode layer 170 is formed on the rough surface 440 through the insulating layer 110, close contact layer 150 and power supply layer 160.

Further, in the above-mentioned respective embodiments, description has been given of an example where the uneven portion 140 is formed after the through hole 120 is formed, and then the through hole 107 is formed. However, the invention is not limited to this. For example, there may also be employed a structure in which after the uneven portion 140 is formed, the through hole 120 and the through electrode 107 are formed, or a structure in which after the through hole 120 and the through electrode 107 are formed, the uneven portion 140 is formed. Further, as shown in FIGS. 2C(a), 2D(a) and 2E(a), there may be employed a structure in which the uneven portion 140 and the through hole 120 are formed at the same time, and then the through electrode 107 is formed.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for manufacturing a substrate having a through electrode formed in at least a portion of a through hole, comprising the steps of:
    forming, on a surface of the substrate situated in the periphery of a portion where the through hole is formed or will be formed, an uneven portion including at least a plurality of recessed portions or a plurality of projecting portions, and the plurality of recessed portions or the plurality of projecting portions are formed in a peripheral direction of the substrate at positions different from each other with respect to the center of the through hole, and wherein the uneven portion forms at least one groove surrounding the periphery of the through hole and is formed as a part of the substrate;
    forming the through electrode in the portion of the through hole;
    forming a close contact layer having a close contact property and a conductive property on an end portion of the through electrode in the through hole and on a surface of the uneven portion; and
    forming an electrode layer on the close contact layer such that the electrode layer fills at least one of the plurality of recessed portions.

2. A method for manufacturing a substrate as set forth in claim 1, further comprising a step of:
    performing a roughening processing on an inner wall of the through hole.

3. A method for manufacturing a substrate as set forth in claim 1, further including a step of:
    forming the close contact layer having a close contact property and a conductive property on the inner wall of the through hole and on the surface of the uneven portion.

4. A method for manufacturing a substrate as set forth in claim 1, comprising a step of:
    forming the through hole in the substrate, wherein the through hole is formed before the uneven portion is formed.

5. A method for manufacturing a substrate as set forth in claim 1, comprising a step of:
    forming the through hole in the substrate, wherein the through hole and the uneven portion are formed at the same time.

6. A substrate comprising:
    a through electrode formed in at least a portion of a through hole formed in the substrate;
    an uneven portion formed on a surface of the substrate in the periphery of the through electrode, and including at least a plurality of recessed portions or a plurality of projecting portions, and the plurality of recessed portions or the plurality of projecting portions are formed in a peripheral direction of the substrate at positions different from each other with respect to the center of the through hole, and wherein the uneven portion forms at least one groove surrounding the periphery of the through hole and is formed as a part of the substrate;
    a close contact layer having a close contact property and a conductive property formed on an end portion of the through electrode in the through hole and on a surface of the uneven portion; and an electrode layer formed on the close contact layer such that the electrode layer fills at least one of the plurality of recessed portions.

7. A substrate as set forth in claim 6, wherein at least a portion of an inner wall of the through hole has a rough surface having a small uneven portion.

8. A substrate as set forth in claim 7, wherein the close contact layer is formed on the inner wall of the through hole and on the surface of the uneven portion and has a close contact property and a conductive property.

9. A method for manufacturing a substrate as set forth in claim 1, further comprising a step of:
    forming an insulating layer over an inner wall of the through hole and the surface of the uneven portion.

10. A method for manufacturing a substrate as set forth in claim 1, further comprising a step of:
    forming an insulating layer over a surface of the substrate including the surface of the recessed portion and an inner wall of the through hole, wherein the electrode layer is insulated with the substrate by the insulating layer.

11. A substrate as set forth in claim 6, further comprising:
    an insulating layer provided over an inner wall of the through hole and the surface of the uneven portion.

12. A substrate as set forth in claim 6, further comprising:
    an insulating layer provided over a surface of the substrate including the surface of the recessed portion and an inner wall of the through hole, wherein the electrode layer is insulated with the substrate by the insulating layer.

\* \* \* \* \*